United States Patent
Jou et al.

(10) Patent No.: US 6,762,554 B2
(45) Date of Patent: Jul. 13, 2004

(54) ELECTROLUMINESCENT DEVICE WITH DRYING FILM AND METHOD FOR FABRICATING THE SAME

(75) Inventors: Jwo-Huei Jou, Hsinchu (TW); Min-Der Lin, Hsinchu (TW); Yung-Sheng Chiu, Taichung (TW); Yen-Shih Huang, Fengyuan (TW); San-Bao Lin, Jungli (TW); Feng-Ju Chuang, Hsinchu (TW)

(73) Assignee: Opto Tech Corporation, Hsinchu (TW)

( * ) Notice: Subject to any disclaimer, the term of this patent is extended or adjusted under 35 U.S.C. 154(b) by 162 days.

(21) Appl. No.: 10/079,480

(22) Filed: Feb. 22, 2002

(65) Prior Publication Data

US 2003/0160563 A1 Aug. 28, 2003

(51) Int. Cl.⁷ .............................. H01J 63/04; H01J 1/62
(52) U.S. Cl. .................. 313/512; 427/66; 313/502; 313/504; 313/506; 313/509
(58) Field of Search .................. 313/502, 504, 313/506, 509, 512; 427/66

(56) References Cited

U.S. PATENT DOCUMENTS 5,882,761 A * 3/1999 Kawami et al. .......... 428/69
5,990,615 A * 11/1999 Sakaguchi et al. ........ 313/504

* cited by examiner

Primary Examiner—Alan Cariaso
Assistant Examiner—Sumati Krishnan
(74) Attorney, Agent, or Firm—Rosenberg, Klein & Lee

(57) ABSTRACT

The present invention discloses an electroluminescent device with a drying film and a method for fabricating the same. The present invention is characterized in that the method comprises: providing a substrate; forming, in sequence from substrate up, a transparent electrode, a luminescent layer, and an opposed electrode; and forming a drying film by providing a raw material composed of barium (Ba), magnesium (Mg) or calcium (Ca) to react with a gaseous reactant composed of oxygen on the surface of the opposed electrode. The drying film composed of barium oxide (BaO), magnesium oxide (MgO) or calcium oxide (CaO) can be employed to absorb the moisture. Therefore, the generation of dark spots can be prevented and the reliability of the device can be improved.

6 Claims, 2 Drawing Sheets

ELECTROLUMINESCENT DEVICE WITH DRYING FILM AND METHOD FOR FABRICATING THE SAME

BACKGROUND OF THE INVENTION

1. Field of the Invention

The present invention generally relates to an electroluminescent (to be abbreviated as "EL" hereinafter) device with a drying film and a method for fabricating the same. The EL device is characterized in that an alkaline-earth metal film composed of barium (Ba), magnesium (Mg) or calcium (Ca) is employed to react with oxygen and form, during the evaporation process for forming the alkaline-earth metal film, an oxide film composed of barium oxide (BaO), magnesium oxide (MgO) or calcium oxide (CaO) functioning as a drying film on the surface of an opposed electrode, so as to prevent the generation of dark spots and to improve the reliability of the device.

2. Description of the Prior Art

The organic EL device has attracted tremendous attention due to its advantages over other display panels. These advantages include larger visual angle, shorter response time, smaller dimension in thickness, lower power consumption, simpler fabrication, no need for backlighting, and the ability for light emitting in a full color range.

Please refer to FIG. 1, which a cross-sectional view showing the structure of an organic EL device in accordance with the prior art. The organic EL device is characterized in that a transparent electrode 12 is formed on a substrate 11, and on the transparent electrode 12 there are an organic layer 13 comprising a hole injection layer, a hole transport layer, an organic emitting layer or an electron transport layer, an opposed electrode 14 and an sealing case 15 are formed by evaporation in turn. Since in an organic EL device the light is generated when the electrons and holes from the transparent electrode 12 and opposed electrode 14 combine in the organic layer 13 to excite the organic emitting layer, it is inevitable that heat is generated during the luminescence process. Once the heat encounters the moisture existing inside the sealing case 15, dark spots due to oxidation will be formed on the surface of the organic layer 13. The existence of such dark spots adversely affects the luminescence qualities such as luminescence intensity and luminescence uniformity of an organic EL device. More seriously, the lifetime of an organic EL device may be substantially shortened.

In order to overcome the image defects due to the undesirable dark spots, some companies have developed a number of prior art organic EL displays to improve the image quality. For example, in the Japanese Patent Nos. JP-A-363890 and JP-A-5-114486, it is disclosed that liquid fluorinated carbon is disposed inside the sealing case 15 to effectively remove the heat generated during the luminescence process. In the Japanese Patent No. JP-A-5-41281, it is disclosed that dehydrating agents such as a synthetic zeolite are mixed in the liquid fluorinated carbon to effectively remove the moisture existing in the periphery of the device.

The above prior arts can reduce the generation of dark spots to some extent; however, the dehydrating agents such as liquid fluorinated carbon may add difficulty to the fabrication process, which is unfavorable for fabrication integration and reduction in cost.

Accordingly, a second prior art structure of an organic EL device is proposed as shown in FIG. 2. In the U.S. Pat. No. 5,882,761, entitled "Organic EL element", it is disclosed that a drying film 17 is attached to the inner surface of a sealing case 15 and an internal space 19 is formed between the drying film 17 and an opposed electrode 14. The solid-state drying film 17 absorbs the moisture existing inside the sealing case 15, so as to prevent the generation of dark spots.

Even though the U.S. Pat. No. 5,882,761 can overcome some of the problems in the prior arts, it still has the following drawbacks:

1. The drying film is attached in the direction perpendicular to the organic layer and the opposed electrode. Therefore, when the device is hit against an external force, the drying film may fall off and directly hit the organic layer or the opposed electrode. In this case, the device will be damaged.
2. The conventionally used temperature for forming such a drying film is higher than 2000° C. This high-temperature condition may adversely affect the fabrication yield and the operation reliability of the organic layer.
3. The drying film is attached in the direction perpendicular to the organic layer and the opposed electrode. In addition, there must be a vertical gap between the drying film and the opposed electrode. Therefore, the total height is increased, which becomes a limit when it comes to designing a downsized device.

SUMMARY OF THE INVENTION

Therefore, the present invention has been made to solve such problems in view of the forgoing status and to further provide an electroluminescent (EL) device, incorporating a drying film directly formed on the surface of the opposed electrode. In this case, the fabrication yield and the operation reliability of the organic layer will not be affected and the generation of dark spots can be prevented, therefore the lifetime of the device is prolonged.

It is the primary object of the present invention to provide a method for fabricating an EL device with a drying film, characterized in that an alkaline-earth metal film composed of barium (Ba), magnesium (Mg) or calcium (Ca) is employed to react with oxygen and form, during the evaporation process for forming the alkaline-earth metal film, an oxide composed of barium oxide (BaO), magnesium oxide (MgO) or calcium oxide (CaO) functioning as a drying film on the surface of an opposed electrode such that the temperature for forming the drying film is substantially reduced. In this case, the operation reliability of the organic layer will not be affected and the generation of dark spots can be prevented so that the lifetime of the device can be prolonged.

It is another object of the present invention to provide an EL device with a drying film, wherein the drying film is formed directly on an opposed electrode at a relatively lowered fabrication temperature. In this case, the drying film may not fall off and damage the device. Moreover, a dry environment is maintained inside the EL device so as to prevent the generation of dark spots and prolong the lifetime of the device.

It is still another object of the present invention to provide an EL device with a drying film, wherein the drying film is directly formed on an opposed electrode, so that the fabrication process can be simplified and the size of the device can be minimized. In this case, the fabrication cost is substantially lowered.

In order to achieve the foregoing objects, the present invention provides a method for fabricating an EL device with a drying film, comprising the steps of: providing a substrate; forming, in sequence from substrate up, a transparent electrode, a luminescent layer, and an opposed electrode; and forming a drying film by providing a raw material to react with a gaseous reactant on the surface of said opposed electrode.

The present invention further provides an EL device with a drying film, comprising: a substrate; at least one transparent electrode formed on the surface of said substrate; an organic layer formed on the surface of said transparent electrode; an opposed electrode formed on the surface of said organic layer; and a drying film formed on the surface of said opposed electrode, wherein said drying film is formed by providing a raw material to react with a gaseous reactant on the surface of said opposed electrode.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE INVENTION

The present invention providing an electroluminescent (EL) device with a drying film, which prevents the generation of undesired dark spots and prolong the lifetime of the device, can be exemplified by the preferred embodiment as described hereinafter.

Figure 1:
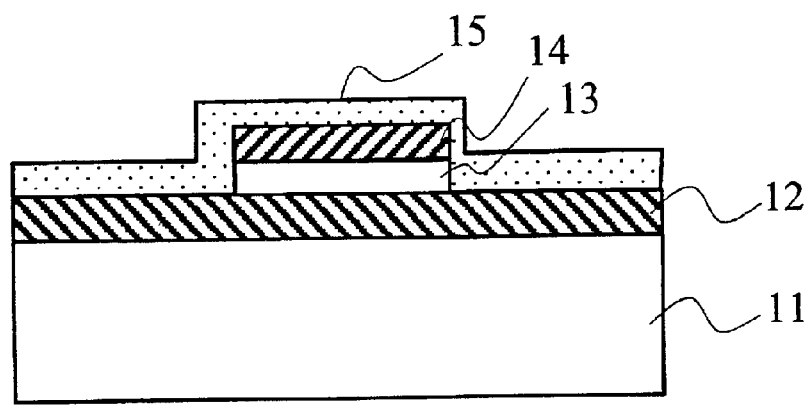
FIG. 1 is a cross-sectional view showing the structure of an organic EL device in accordance with the prior art.
Figure 2:
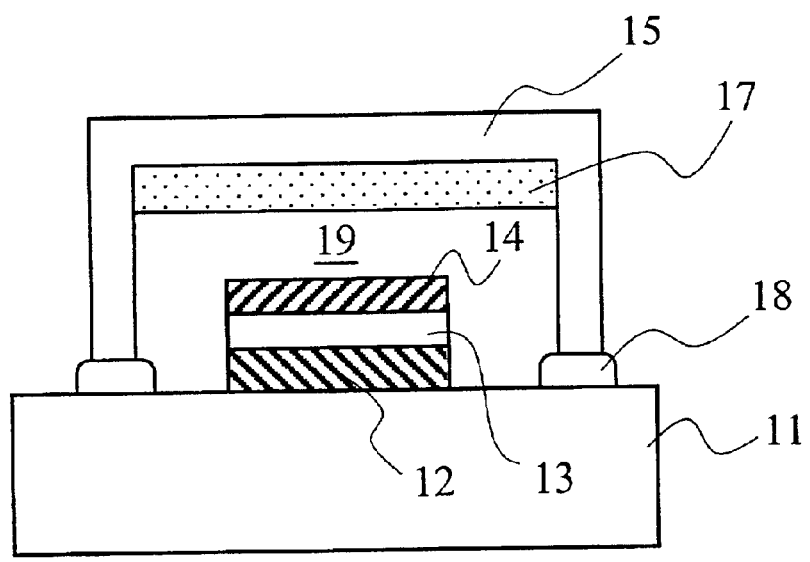
FIG. 2 is a cross-sectional view showing the structure of another organic EL device in accordance with the prior art.
Figure 3:
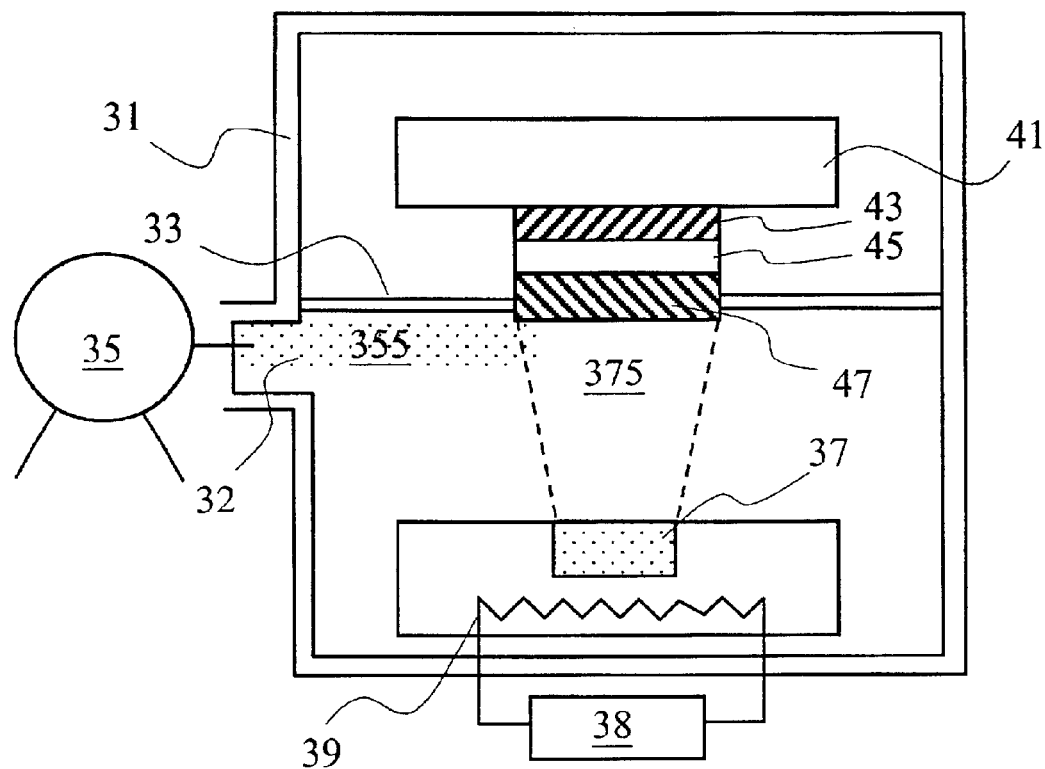
FIG. 3 is cross-sectional view showing the fabricating process of a drying film in accordance with the preferred embodiment of the present invention.
Figure 4:
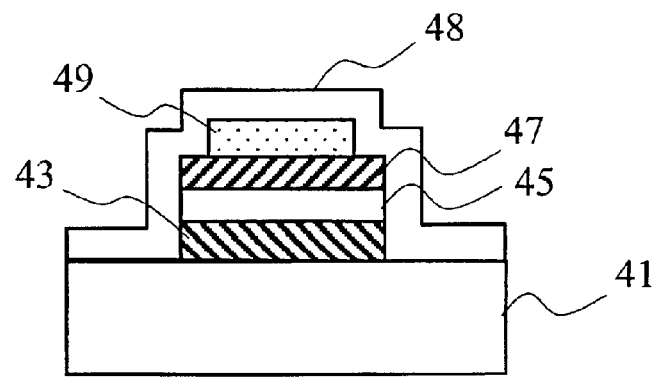
FIG. 4 is a cross-sectional view showing the structure of an EL device in accordance with the preferred embodiment of the present invention.

To start with, please refer to FIG. 3 and FIG. 4, which are cross-sectional views showing the fabricating process of a drying film and an EL device in accordance with the preferred embodiment of the present invention. As shown in the figures, the EL device comprises: a substrate 41; at least one transparent electrode 43 composed of a transparent material (such as ITO, IZO, or other transparent thin metal films) on the surface of the substrate 41; an organic layer 45, comprising at least one organic luminescent layer formed by evaporation or sputtering on the surface of the transparent electrode 43; and an opposed electrode 47, formed by evaporation or sputtering on the organic layer 45. The sample is placed in a chamber 31, in which there is a raw material 37 composed of barium (Ba), magnesium (Mg) or calcium (Ca) facing, along a supplying channel 375, the opposed electrode 47.

When a power supply 38 applies a current to activate a heater 39 that heats up the raw material 37. When the raw material 37 then evaporates towards the opposed electrode 47 along the supplying channel 375, a gaseous reactant 355 such as oxygen is provided by a gaseous reactant supplier 35 and then flows in a path 32 towards the supplying channel 375.

The raw material 37 reacts with oxygen 355 before the raw material 37 arrives at the surface of the opposed electrode 47. Therefore, an oxide film 49 composed of barium oxide (BaO), magnesium oxide (MgO) or calcium oxide (CaO) is formed on the surface of the opposed electrode, as shown in FIG. 4.

The oxide functions as a drying film that can chemically absorb the moisture and never release the moisture back, so that the organic layer 45 is kept dehumidified. It is very helpful to prevent the generation of dark spots, improve the reliability and prolong the lifetime of the device.

Thereafter, a sealing layer 48 is formed to cover the exposed surface of the substrate 41, the transparent electrode 43, the organic layer 45, the opposed electrode 47 and the drying film 49. In this manner, an EL device with a drying film is fabricated. Such an EL device is downsized and the fabrication process is simplified.

In the present invention, the oxide film 49 (BaO, MgO or CaO) is not formed on the opposed electrode 47 by evaporation or sputtering as disclosed in the prior art. Instead, the raw material 37 is heated and evaporates towards the opposed electrode 47 before it reacts with oxygen 355 and forms an oxide film 49 under a temperature of 400° C. Compared to the temperature for directly forming the oxide film by evaporation, which is usually more than 2000° C, the temperature for forming the oxide film according to the present invention is substantially lowered.

Furthermore, oxygen 355 may also reacts with the organic layer 45, which damages the device. Therefore, an isolating member 33 is provided to attach the lateral side of the opposed electrode 47 such that oxygen 355 is prevented from reacting with the organic layer 45. In this case, the fabrication yield is improved.

The method according to the present invention is exemplified but not limited by the preferred embodiment that is used for fabricating an organic EL device. Instead, it can be used for fabricating any device that may suffer from moisture and high temperature.

According to the above discussion, the present invention discloses an EL device with a drying film and a method for fabricating the same, characterized in that an alkaline-earth metal film composed of barium (Ba), magnesium (Mg) or calcium (Ca) is employed to react with oxygen and form an oxide film composed of barium oxide (BaO), magnesium oxide (MgO) or calcium oxide (CaO) functioning as a drying film on the surface of an opposed electrode, so as to prevent the generation of dark spots and to improve the reliability of the device. Therefore, the present invention has been examined to be progressive, advantageous and applicable to the industry.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A method for fabricating an electroluminescent device with a drying film, comprising the steps of:

providing a substrate;

forming, in sequence from substrate up, a transparent electrode, a luminescent layer, and an opposed electrode; and forming a drying film, by providing a raw material to react with a gaseous reactant, on the surface of said opposed electrode, said step of forming said drying film including the step of forming said drying film on the surface of said opposed electrode in a chamber wherein said gaseous reactant is provided by a gaseous reactant supplier and then flows in a path towards a channel through which said raw material passes.

2. The method as recited in claim 1, further comprising the step of providing an isolating member to attach the lateral side of said opposed electrode.

3. A method for fabricating an electroluminescent device with a drying film, comprising the steps of:

providing a substrate;

forming, in sequence from substrate up, a transparent electrode, a luminescent layer, and an opposed electrode; and forming a drying film, by providing a raw material to react with a gaseous reactant, on the surface of said opposed electrode, said raw material being introduced towards said opposed electrode by a process selected from the group consisting of evaporation and sputtering.

4. A method for fabricating a drying film, comprising the steps of:

providing a raw material to react with a gaseous reactant and forming a drying film on the surface of a device, said step of forming said drying film including the step of forming said drying film on the surface of said device in a chamber wherein said gaseous reactant is provided by a gaseous reactant supplier and then flows in a path towards a channel through which said raw material passes.

5. A method for fabricating a drying film, comprising the steps of:

providing a raw material to react with a gaseous reactant;

forming a drying film on the surface of a device; and providing an isolating member to attach a lateral side of said device.

6. A method for fabricating a drying film, comprising the steps of:

providing a raw material to react with a gaseous reactant and forming a drying film on the surface of a device, said raw material being introduced towards said device by a process selected from the group consisting of evaporation and sputtering.

* * * * *